United States Patent [19]

Akiba et al.

[11] Patent Number: 4,653,059
[45] Date of Patent: Mar. 24, 1987

[54] DISTRIBUTED FEEDBACK SEMICONDUCTOR LASER

[75] Inventors: Shigeyuki Akiba, Tokyo; Katsuyuki Utaka, Musashino; Kazuo Sakai, Tokyo; Yuichi Matsushima, Tanashi, all of Japan

[73] Assignee: Kokusai Denshin Denwa Kabushiki Kaisha, Tokyo, Japan

[21] Appl. No.: 688,566

[22] Filed: Jan. 3, 1985

[30] Foreign Application Priority Data

Jan. 17, 1984 [JP] Japan ................................. 59-4721

[51] Int. Cl.$^4$ ............................................. H01S 3/19
[52] U.S. Cl. ........................................ 372/50; 372/49; 372/96
[58] Field of Search .................. 372/96, 50, 45, 49; 357/17

[56] References Cited

U.S. PATENT DOCUMENTS 4,516,243  5/1985  Utaka et al. ........................ 372/96
4,553,239  11/1985  Akiba et al. ........................ 372/50

Primary Examiner—James W. Davie
Attorney, Agent, or Firm—Robert E. Burns; Emmanuel J. Lobato; Bruce L. Adams

[57] ABSTRACT

A distributed feedback semiconductor laser which has periodic corrugations formed in a light emitting layer or an adjoining layer to extend in the direction of travel of light. A window region formed by a semiconductor layer larger in energy gap than the light emitting layer is provided on the extension line of one end of a laser region formed in the light emitting layer. The length of the window region is so limited as to prevent substantial reflection of laser output light in the window region. The end face of the laser on the opposite side from the window region is coated with a film for increasing reflectivity.

4 Claims, 4 Drawing Figures

DISTRIBUTED FEEDBACK SEMICONDUCTOR LASER

BACKGROUND OF THE INVENTION

The present invention relates to improvement in or relating to a distributed feedback semiconductor laser (hereinafter referred to simply as a "DFB" laser).

(Prior Art)

The DFB laser is now being developed for its application, as a high performance light source capable of a single-wavelength operation, to low-loss optical fiber communications. However, the conventional laser has a defect of low output utilization efficiency as described below.

SUMMARY OF THE INVENTION

It is an object of the present invention to provide a distributed feedback semiconductor laser which is intended to obviate defects of such a window-structured laser as described above and which permits improvements of the output efficiency and reduction of the oscillation threshold current.

To attain the above object of the present invention, there is provided a distributed feedback semiconductor laser which has periodic corrugations formed in a light emitting layer or an adjoining layer to extend in the direction of travel of light and in which a window region formed by a semiconductor layer larger in energy gap than the light emitting layer is provided on the extension line of one end of a laser region formed in the light emitting layer, characterized in that the length of the window region is so limited as to prevent substantial reflectioon of laser output light in the window region and that the end face of the laser on the opposite side from the window region is coated with a film for increasing reflectivity.

BRIEF DESCRIPTION OF THE DRAWINGS

The present invention will be described in detail below in comparison with prior art with reference to the accompanying drawings, in which.

DETAILED DESCRIPTION

Figure 1:
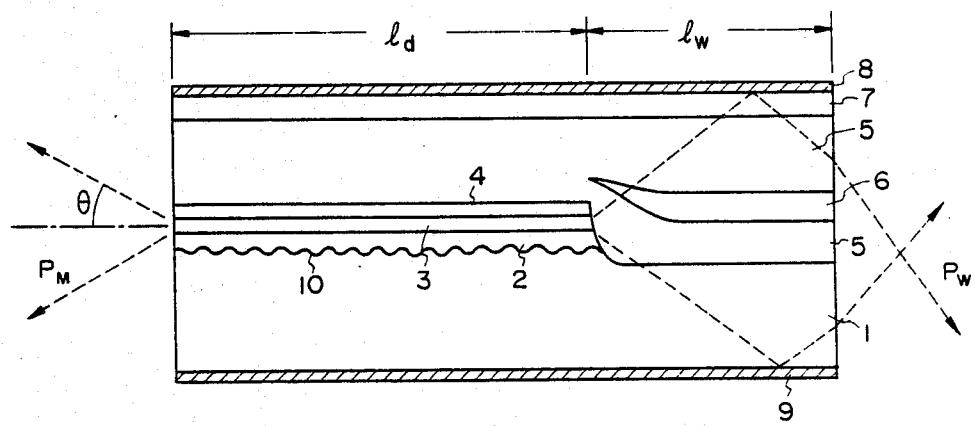
FIG. 1 is a schematic cross-sectional view of a conventional window-structure distributed beedback laser.

To make differences the conventional art and the present invention clear, an example of a conventional DFB laser will first be described with reference to FIG. 1. The illustrated example employs InP for the substrate and a material of the InGaAsP alloyes which is lattice-matched therewith. An n-type InGaAsP waveguide layer 2, an InGaAsP light emitting layer 3, a p-type InGaAsP buffer layer 4, a p-type InP clad layer 5 and a p-type InGaAsP cap layer 7 are laminated on an n-type InP substrate 1, and electrodes 8 and 9 are disposed on the top surface of the cap layer 7 and on the underside of the substrate 1, respectively. The waveguide layer 2 has formed therein periodic corrugations 10 in the direction of travel of light, and an injection of current into the light emitting layer 3 will produce the laser oscillation. On one of the lines of extension of a laser region (whose length is identified by $l_d$) in which the light emitting layer 3 is disposed, there is provided a window region (whose length is identified by $l_w$) which is made up of the p-type InP layer 5 and an n-type InP layer 6. Since this window region has no waveguide function, the Fabry-Perot mode oscillation is appreciably restricted. Because of such an asymmetrical structure that has a reflectivity of about 30% at the left-hand end where the laser oscillation region including the light emitting layer 3 is disposed but no window region is provided, and an extremely low reflectivity at the right-hand end where the window region is disposed, only the DFB mode by the periodic corrugations 10 assumes a low oscillation threshold value, facilitating the occurrence of single-wavelength oscillation.

Figure 2:
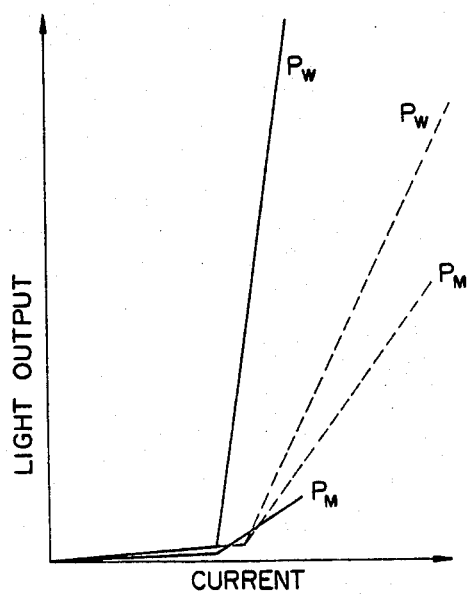
FIG. 2 is a graph showing, by way of example, the input-output characteristics of the conventional and this invention DFB lasers.

With the DFB laser having such a window structure, its light output is also asymmetrical. Letting the output from the window region be represented by $P_W$ and the output from the end face on the opposite side from the window region by $P_M$ the relationships of the outputs $P_W$ and $P_M$ to an injected current (the input-output characteristic) are usually such as indicated by the broken lines in FIG. 2. That is, the output $P_W$ from the window region is larger than the output from the end face on the side opposite therefrom. In the prior art example shown FIG. 1, however, since the window region is disposed merely for suppressing the Fabry-Perot mode, the length $l_w$ of the window region is as large as several ten to several hundred μm. Consequently, the emitted light is reflected by the electrodes 8 and 9 in the window region, as indicated by the broken lines, and the emission pattern of the output light $P_W$ from the window region is disturbed; therefore the output $P_W$ is difficult to utilize as the laser output, and the output $P_M$ is exclusively employed. Accordingly, the conventional laser has a defect of low output utilization efficiency.

With reference to the accompanying drawings, the present invention will hereinafter be described in detail.

Figure 3:
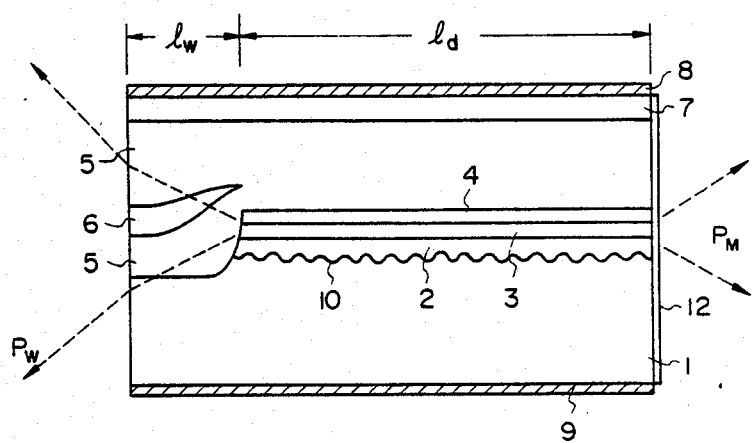
FIGS. 3 and 4 are schematic cross-sectional views of DFB lasers of the present invention.

FIG. 3 illustrates an embodiment of the present invention, in which the length $l_w$ of the window region is limited specifically to a value equal to or several times larger than a distance between the light emitting layer 3 and the electrode 8 or 9 so that no substantial reflection of emitted light occurs in the window region. Such an arrangement does not disturb the light emission pattern but enable efficient convergence of the output light and permits utilization of the output $P_W$ as the laser output. On the other hand, even with such a reduced length $l_w$ of the window region, the Fabry-Perot mode can be sufficiently suppressed. Furthermore, at the end face opposite to the window region is given a coating 12 for raising reflectivity. This decreases the oscillation threshold current and increases the asymmetry of the output, as indicated by the solid lines in FIG. 2. Accordingly, the efficiency of utilization of the output is markedly improved. The output $P_M$ becomes very small but can be used for monitoring.

Figure 4:
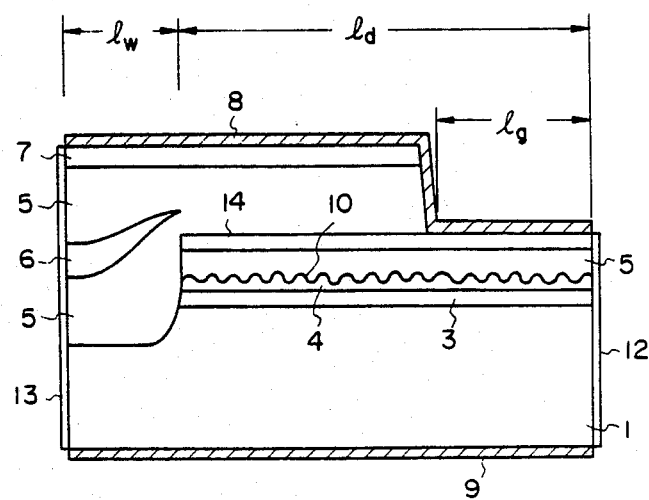

FIG. 4 illustrates another embodiment of the present invention, in which the periodic corrugations 10 are formed on the surface of the buffer layer 4. For suppressing the TM mode to achieve a stable single-wavelength operation by the TE mode, a part of the metallic electrode 8 is disposed in proximity to the light emitting layer 3 over a length $l_g$. Moreover, the end face of the window region is covered with a film 13 for decreasing reflectivity, for example, an antireflection coating film, thereby further improving the efficiency of emission of light from the window region. A p-type InGaAsP layer 14 sandwiched between the electrode 8 and the p-type InP clad layer 5 is provided for allowing ease in controlling the position of the electrode 8 by selective chemical etching when forming a portion of the electrode near the light emitting layer 3.

In the embodiments described above, the reflecting film 12 can be formed by alternately laminating in layers $Al_2O_3$ and C (or $SiO_2$) films, each having a thickness of ¼ a working wavelength $\lambda$, or by laminating a $SiO_2$ film and a metallic film, each having a thickness of $\lambda/2$. The antireflection film 13 can be formed by an $Al_2O_3$ or $Si_3N_4$ film having a thickness of $\lambda/4$.

While in the foregoing description no reference has been made to a striped structure for stabilizing the lateral mode, it is needless to say that the present invention is applicable to various striped structures such as a buried heterostructure and a plano-convex waveguide structure. In addition, the present invention is applicable not only to semiconductor materials of the InGaAsP/InP series but also to other semiconductor materials of the InAlGaAs/InP, AlGaAs/GaAs alloyes and so forth.

As has been described in the foregoing, the distributed feedback laser of the present invention has a low oscillation threshold value and achieves great improvements in the output efficiency, as compared with the conventional lasers. Furthermore, according to the DFB laser of the present invention, the output is emitted through the window region, even if an optical fiber or the like is attached to the end face of the window region in close contact therewith, no influence is exerted on the laser characteristics and the coupling efficiency including the incidence to the optical fiber or the like is also raised. Accordingly, the DFB laser of the present invention is applicable to low-loss optical fiber communications and the like, and hence is of great utility.

What we claim is:

1. A distributed feedback semiconductor laser comprisng: a light emitting layer, an adjoining layer next to the light emitting layer, one of the light emitting layer and said adjoining layer having periodic corrugations extending in the direction of travel of light in said light emitting layer, electrodes provided for effecting injection of carriers into said light emitting layer for performing laser oscillation, and a window region formed by a semiconductor layer larger in energy gap than the light emitting layer disposed on an imaginary projection line of one end of the light emitting layer adjoining thereto, characterized in that the length of the window region is limited to prevent reflection of laser output light in the window region and that the end face of the laser on the opposite end from the window region is coated with a film to increase reflectivity.

2. A distributed feedback semiconductor laser according to claim 1, in which a part of one of the electrodes adjacent the end face coated with the film is disposed in closer proximity to the light emitting layer than the remainder thereof.

3. A distributed feedback semiconductor laser according to claim 1, in which the length of the window region is less than several times a distance between the light emitting layer and one of the electrodes.

4. A distributed feedback semiconductor layer according to claim 3, in which the length of the window is substantially equal to a distance between the light emitting layer and one of the electrodes.

* * * * *